(12) United States Patent  
Meng et al.

(10) Patent No.: US 7,023,269 B2
(45) Date of Patent: Apr. 4, 2006

(54) DIGITAL AMPLIFIER AND METHODS FOR ENHANCING RESOLUTION AND DYNAMIC RANGE OF A DIGITAL AMPLIFIER

(75) Inventors: Yongmin Meng, Hong Kong SAR (CN); Longhai Ye, Hong Kong SAR (CN); Yiu Cheung Brian Li, Hong Kong SAR (CN)

(73) Assignee: GPE International Limited, New Territories (HK)

( * ) Notice: Subject to any disclaimer, the term of this patent is extended or adjusted under 35 U.S.C. 154(b) by 42 days.

(21) Appl. No.: 10/935,418

(22) Filed: Sep. 8, 2004

(65) Prior Publication Data

US 2006/0049869 A1   Mar. 9, 2006

(51) Int. Cl.
*H03F 3/38* (2006.01)
(52) U.S. Cl. ....................................................... 330/10
(58) Field of Classification Search .................. 330/10, 330/207 A, 251; 375/238, 297
See application file for complete search history.

(56) References Cited

U.S. PATENT DOCUMENTS

| 3,560,829 A | 2/1971 | Brennan |
| 5,075,634 A | 12/1991 | French |
| 5,422,597 A | 6/1995 | Stengel et al. |
| 6,028,944 A | 2/2000 | Markow et al. |
| 6,118,337 A | 9/2000 | Schweighofer |
| 6,160,445 A | 12/2000 | Schweighofer |
| 6,492,868 B1 | 12/2002 | Kirn |
| 6,509,793 B1 | 1/2003 | Kim |
| 6,552,607 B1 | 4/2003 | Danielson |
| 6,593,807 B1 * | 7/2003 | Groves et al. ................. 330/10 |
| 6,812,785 B1 * | 11/2004 | Masuda et al. ................ 330/10 |
| 2002/0070799 A1 | 6/2002 | Dahan et al. |
| 2002/0135419 A1 | 9/2002 | Groves, Jr. et al. |
| 2004/0066228 A1 | 4/2004 | Lennartson et al. |

FOREIGN PATENT DOCUMENTS

| EP | 1 406 381 A1 | 4/2004 |
| WO | 2004/010575 A1 | 1/2004 |

OTHER PUBLICATIONS

*International Search Report dated Aug. 26, 2005.

* cited by examiner

*Primary Examiner*—Robert Pascal
*Assistant Examiner*—Hieu Nguyen
(74) *Attorney, Agent, or Firm*—Buchanan Ingersoll PC

(57) ABSTRACT

An amplifier including a difference amplifier, said difference amplifier including a first output and a second output which are adapted for providing a PWM signal output to a load by signal difference between said first and said second outputs, said difference amplifier being adapted for operating in at least first and second alternative operating modes which are respectively characterised by first and second operating voltages, wherein during transition from one operating mode to another, the pulse area of the pulses of said first and second outputs of said difference amplifier are changed according to a pre-determined manner so that the pulse area of pulses of said first and second outputs at the end of said transitional mode is equivalent to the pulse area of the pulses of said first and second outputs immediately after the change of operating modes.

23 Claims, 12 Drawing Sheets (a) Large Signal (b) Small Signal

Small Signal Amplification

Large Signal Amplification

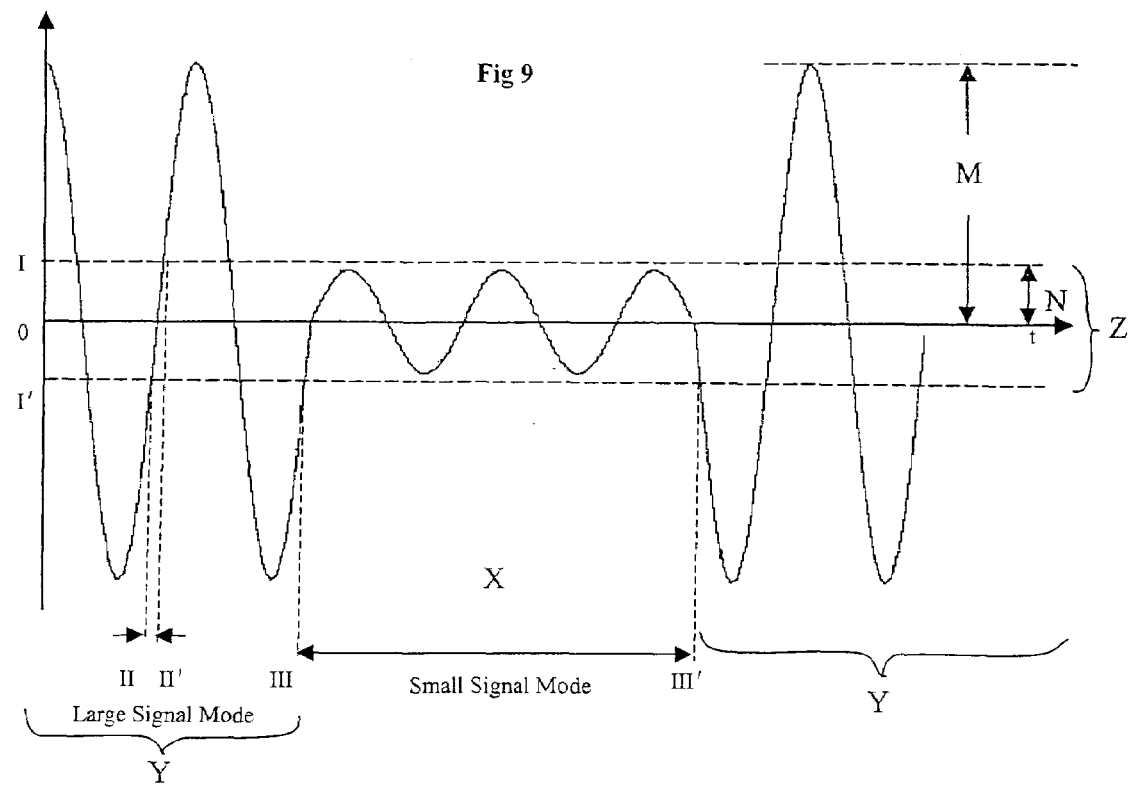
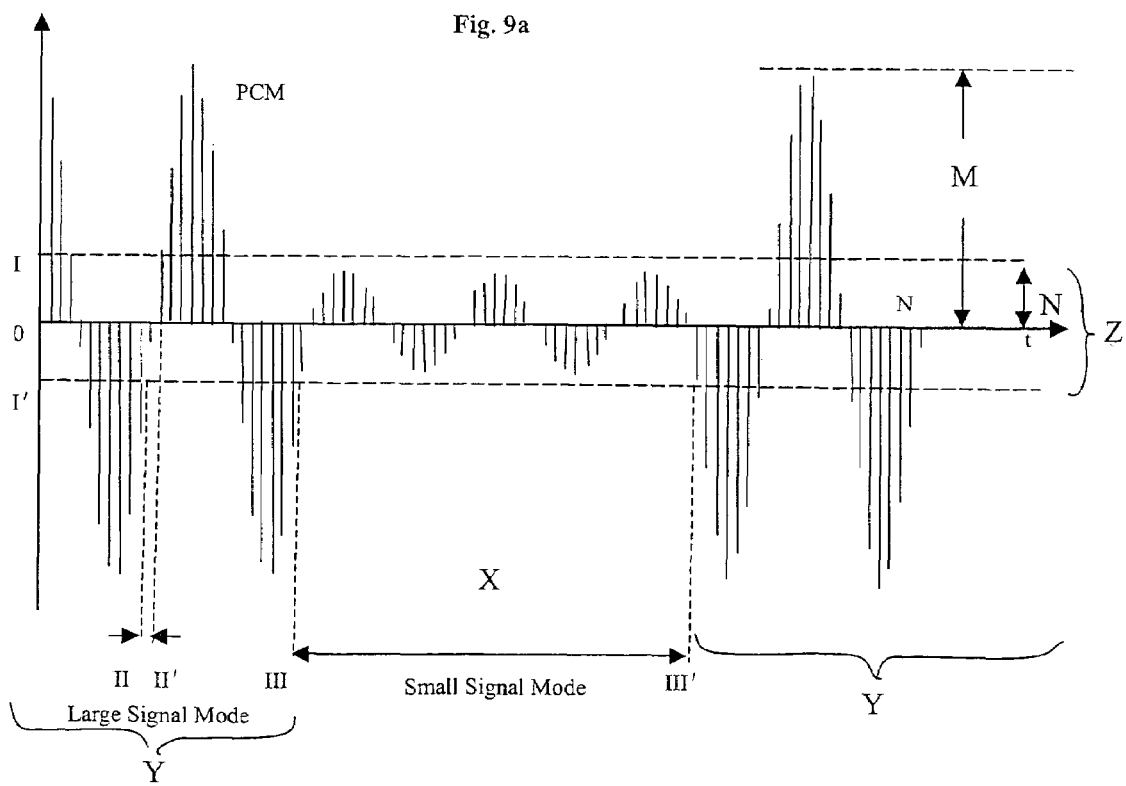

Pulse width using lower voltage 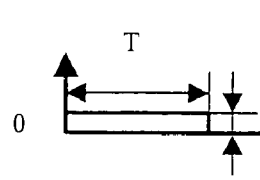 Equivalent to 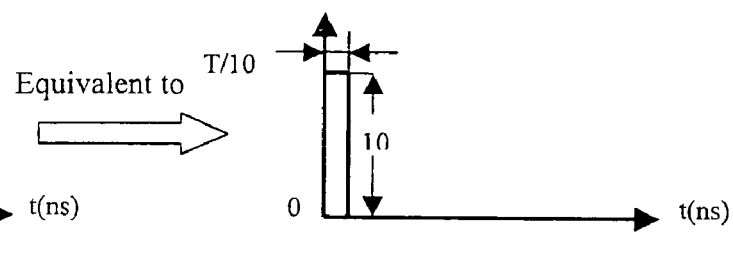 Pulse width using higher voltage
Fig. 14

DIGITAL AMPLIFIER AND METHODS FOR ENHANCING RESOLUTION AND DYNAMIC RANGE OF A DIGITAL AMPLIFIER

FIELD OF THE INVENTION

The present invention relates to amplifiers and, more particularly, to digital power amplifiers such as PWM amplifiers or amplifiers including PWM amplification schemes, means or apparatus. More specifically, although of course not solely limited thereto, this invention relates to digital amplifiers or digital amplifying schemes, means or apparatus incorporating a difference or bridge-type PWM power amplifying stage. This invention also relates to amplifiers, whether digital or mixed digital and analogue, incorporating a digital amplifying scheme, means or apparatus.

BACKGROUND OF THE INVENTION

Digital audio and video products have become very popular because of their many advantages such as high signal fidelity. In the past, digital signals of such digitised audio and video products, such as CDs and LDs, were usually converted into analogue signals before amplification for output. With the increasing availability of audio and visual products in digitised forms, it has been noted that analogue conversion of the digital signals for amplification before output to the appropriate load, for example, speakers or TV monitors, would introduce additional errors and distortions. Hence, it is generally accepted that direct amplification of the digital signals for output to the appropriate loads would be preferable.

In a typical full digital system, pulse-code-modulated (PCM) signals are usually output from a signal content source. The PCM signals are then converted into pulse-width-modulated (PWM) signals for amplification by a PWM amplifier. Compared with analogue amplifiers, digital amplifiers are known to have the advantages of having a compact size, high efficiency, low cross-channel interference and high fidelity. Thus, in a typical digital system, PCM signals are first converted into PWM signals for amplification by a PWM amplifier. However, it is well known that it is difficult to obtain both a high dynamic range and a high resolution in a digital amplification system.

For example, for a 16 bit PCM system at a sampling frequency of 44.1 KHz, a digital signal processor (DSP) will be required to have a clock rate of $f_{clk}=2^{16}f_c=2^{16}\times44.1=2.89$ GHz. When 8 times interpolation is used, the clock requirement on the DSP will then become $f_{clk}=8\cdot2^{16}f_c=8\times2^{16}\times44.1=23.1$ GHz. Although such a clock rate may become practical in the future, it is highly desirable and will be more economical if there can be provided means to enhance signal resolution and dynamic range without depending on the availability of a DSP with such a high clock rate. To alleviate the requirements of such a high clock rate for a higher signal resolution, prior art suggested using 8 bit PWM signal conversion of a 16 bit PCM signal so that a DSP clock rate of $f_{clk}=8\cdot2^8 f_c=8\times2^8\times44.1=90.3$ MHz, which corresponds to a minimum pulse width of 11 ns, can be used. However, such an approach introduces higher quantization noise and results in loss in fidelity which is contrary to the purpose of using a 16 bit system and also represents a loss in the DSP performance.

For a typical 16 bit PCM system at an original sampling frequency of 44.1 KHz, it is common to increase the sampling frequency to 352.8 KHz by 8 times interpolation so that the PWM frequency is at 352.8 KHz with a maximum PWM pulse width of $1/352.8\text{KHz}=2834$ ns. Hence, the minimum and maximum pulse width of the PWM pulse are respectively 11 ns and 2834 ns, corresponding to a resolution of 11 ns/2834 ns$=3.88\times10^{-3}$ which is not sufficient for high fidelity acoustic reproduction. Furthermore, as the pulse width variation steps are evenly distributed across the entire pulse width of a typical PWM format, the resolution at the lower end of the input signal amplitude will be limited, thus affecting the resolution and the dynamic range. On the other hand, while the use of a DSP with a higher clock rate will result in a narrower pulse width and therefore higher resolution and lower noise, the resulting problems such as higher costs, electromagnetic interference, problems associated with high speed circuitry design as well as additional pins, make this approach non-attractive. Therefore, it is highly desirable if there can be provided improved means, methods, apparatus and device for enhanced PWM signal amplifications.

OBJECT OF THE INVENTION

Accordingly, it is an object of the present invention to provide means, devices, apparatus, methods and schemes for enhanced PWM signal amplifications. More specifically, it is an object of the present invention to provide means, methods, schemes, device and apparatus for PWM signal amplification with improved fidelity without substantially increasing the DSP clock rate. Yet more specifically, it is another object of the present invention to provide means, methods, schemes, device and apparatus for PWM signal amplification with improved fidelity and improved dynamic range. Of course, the above objects are to be read disjunctively at the minimum of providing the public with a useful choice.

SUMMARY OF THE INVENTION

According to the present invention, there is provided an amplifier including a difference amplifier and signal processing means, said difference amplifier including a first output and a second output which are adapted for providing a PWM signal output to a load by signal difference between said first and said second outputs, said difference amplifier being adapted for operating in at least first and second alternative operating modes which are respectively characterised by first and second operating voltages, said signal processing means including means to adjust the output voltages of said first and second outputs, so that, during transition from one operating mode to another, the output voltages of said first and second outputs of said difference amplifier being changed according to a pre-determined manner so that there is a substantial degree of continuity of the output voltages of said first and second outputs and said PWM output during the transition.

Generally speaking, this invention has described a digital amplifier comprising a difference amplification means and control means, said difference amplification means comprising means for amplifying first and second pulsed signal streams for producing an amplified signal stream by difference, said difference amplification means operating in first and second alternative operating modes for outputting pulsed signals at first and second voltage levels of unequal amplitudes, said control means gradually changing the pulse widths of signal pulses of said first and second pulsed signal streams during transition between said first and said second operating modes while maintaining a substantially constant difference between the pulse area of the corresponding individual pulses of said first and second pulsed signal streams.

Broadly speaking, this invention provides a digital amplifier comprising a difference amplification means and control means, said difference amplification means comprising means for amplifying first and second pulsed signal streams for producing an amplified signal stream by difference, said difference amplification means operating in first and second alternative operating modes for outputting pulsed signals at first and second voltage levels of unequal amplitudes, said control means gradually changing the pulse widths of signal pulses of said first and second pulsed signal streams during transition between said first and said second operating modes while maintaining a substantially constant difference between the pulse area of the corresponding individual pulses of said first and second pulsed signal streams.

In an example, the first and second operating modes are respectively large and small signal operating modes with the first voltage level significantly higher than the second voltage level, the pulse width of the individual signal pulses of the first and second pulsed signal streams being gradually increased for the same extent during transition from the large signal operating mode to the small signal operating mode. On the other hand, the pulse width of the individual signal pulses of the first and second pulsed signal streams being increased and then gradually decreased for the same extent during transition from the small signal operating mode to the large signal operating mode.

According to another aspect of the present invention, there is provided an amplifier including a difference amplifier, said difference amplifier including a first output and a second output which are adapted for providing a PWM signal output to a load by signal difference between said first and said second outputs, said difference amplifier being adapted for operating in at least first and second alternative operating modes which are respectively characterised by first and second operating voltages, wherein during transition from one operating mode to another, the pulse area of the pulses of said first and second outputs of said difference amplifier are changed according to a pre-determined manner so that the pulse area of pulses of said first and second outputs at the end of said transitional mode is equivalent to the pulse area of the pulses of said first and second outputs immediately after the change of operating modes.

According to a preferred embodiment of the present invention, there is provided an amplifier including control means, signal processing means and a difference amplifier, said difference amplifier including a first output and a second output which are adapted for PWM signal output to a load by signal difference between said first and said second outputs, said difference amplifier being adapted for operating in at least first and second alternative operating modes which are respectively characterised by first and second operating voltages, said control means including means for evaluating the signal characteristics of an incoming signal, means for determining the operating modes of said difference amplifier according to predetermined criteria and means for controlling the operating modes of said difference amplifier, so that, upon detection of a transition signal, said difference amplifier will enter into transition mode before changing its operating modes, wherein, during said transition mode, the pulse area of the pulses of said first and second outputs of said difference amplifier is changed according to a pre-determined manner so that the pulse area of pulses of said first and second outputs at the end of said transitional mode is comparable and/or equivalent to that immediately after the change of said operating modes.

Preferably, the pulse area of the pulses of said first and said second outputs are gradually changed during said transition by changing their pulse width so that there is a substantial continuity of the relevant pulse area of the pulses at the end of said transition mode and immediately after change of operating modes is substantially equal.

Preferably, the pulse area of the pulses of said first and said second outputs are gradually changed during said transition by changing their pulse width so that the relevant pulse area of the pulses at the end of said transition mode and immediately after change of operating modes is substantially equal.

Preferably, said first operating voltage being higher than said second operating voltage, wherein, during transition from said first operating mode to said second operating mode, the pulse area of pulses of said first and second outputs of said difference amplifier being gradually reduced.

Preferably, during transition from said second operating mode to said first operating mode, the pulse area of said pulses of said first and said second outputs of said difference amplifier being gradually increased.

Preferably, said PWM signal output to said load being provided by signal difference between said first and said second outputs, characterized in that said output PWM signal output being substantially symmetrical about the centreline of the respective PWM cycle except during transition between operating modes.

Preferably, said first operating voltage being higher than said second operating voltage, characterized in that, during transition from said first operating mode to said second operating mode, the output PWM pulses being gradually shifted from the centreline towards the right end of a PWM cycle.

Preferably, during transition from said second operating mode to said first operating mode, the output PWM pulses being gradually shifted from the right side towards the centreline of a PWM cycle.

Preferably, during transition from said first operating mode to said second operating mode, the pulse height of said PWM pulse being substantially characteristic of said first operating mode.

Preferably, during transition from said second operating mode to said first operating mode, the pulse height of said PWM pulse during transition being also substantially characteristic of said first operating mode.

Preferably, said difference amplifier including a first output and a second output which are adapted for providing a PWM signal output to a load by signal differencing between said first and said second outputs, said difference amplifier being adapted for operating in at least first and second alternative operating modes which are respectively characterised by first and second operating voltages, wherein pulses of said PWM signal output being substantially symmetrical about the centreline of their respective PWM cycles during said first and second operating modes and being drifted away from said centreline during transition from one operating mode to another so that voltage continuity at said first and said second outputs can be provided during said transition. It will be observed that said transition control means causes said PWM pulses to drift away from said centreline upon detection of a transition signal.

Preferably, drifting of said PWM pulses from said centreline being co-incident with the gradual changing of the pulse width of pulses of said first and said second outputs of said difference amplifier.

Preferably, when said difference amplifier changes from said first operating mode of a higher characteristic operating mode of a higher characteristic operating voltage to said second operating mode of a lower characteristic operating voltage, the pulses of said first and second outputs being gradually narrowed while said PWM pulses being shifted gradually towards the right side of the PWM cycle centre-line.

Preferably, when said difference amplifier changes from said second operating mode to said first operating mode, the pulses of said first and second outputs of said difference amplifier being gradually broadened while said PWM pulses being shifted gradually towards the centreline of the PWM cycle from the right edge of the PWM cycle.

Preferably, said predetermined criteria including the continuous reading of samples exceeding a threshold number and below a threshold amplitude.

Preferably, said pre-determined manner including gradual adjustment of the voltage of said first and said second outputs of said difference amplifier while maintaining a correct differential PWM output.

Preferably, said pre-determined manner including gradual adjustment of the voltage area of the pulses of said first and said second outputs of said difference amplifier while maintaining a correct voltage area of said PWM output.

BRIEF DESCRIPTION OF THE DRAWINGS

Preferred embodiments of the present invention will be explained in further details below by way of examples and with reference to the accompanying drawings, in which:

FIG. 9 shows an exemplary analogue waveform from a signal source which is to be converted into PCM signals for subsequent amplification by the PWM amplifier of the present invention to assist understanding of transition between the different operating modes of the present invention, FIG. 9a shows the sampled waveform of FIG. 9 for subsequent conversion into PCM signals for inputting to the front end 100 of FIG. 1.

FIG. 14 shows schematic diagrams of two pulses of different voltage amplitude but of the same area exemplifying the general principle of the present invention.

DETAILED DESCRIPTION OF THE PREFERRED EMBODIMENTS

Figure 1:
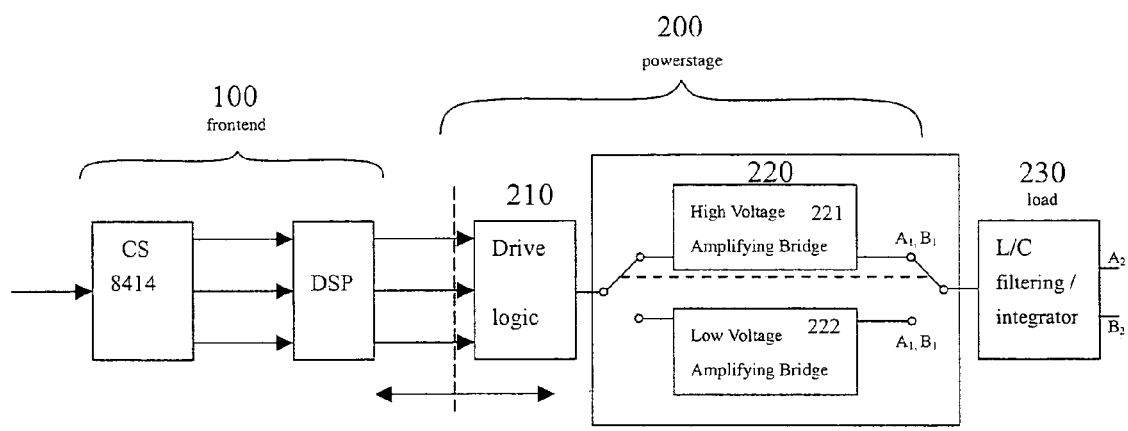
FIG. 1 is a block diagram showing in schematic form an amplifier of the present invention.
Figure 2:
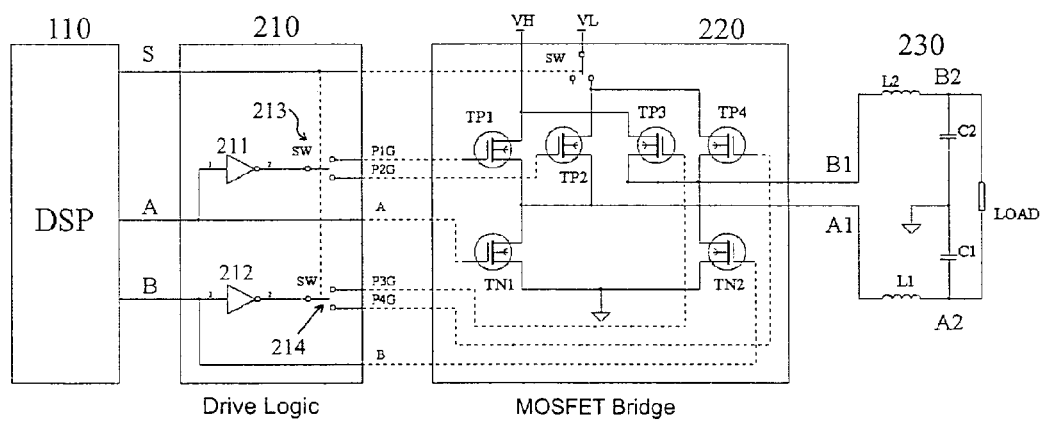
FIG. 2 shows in further detail the building blocks of the amplifier of FIG. 1.
Figure 3:
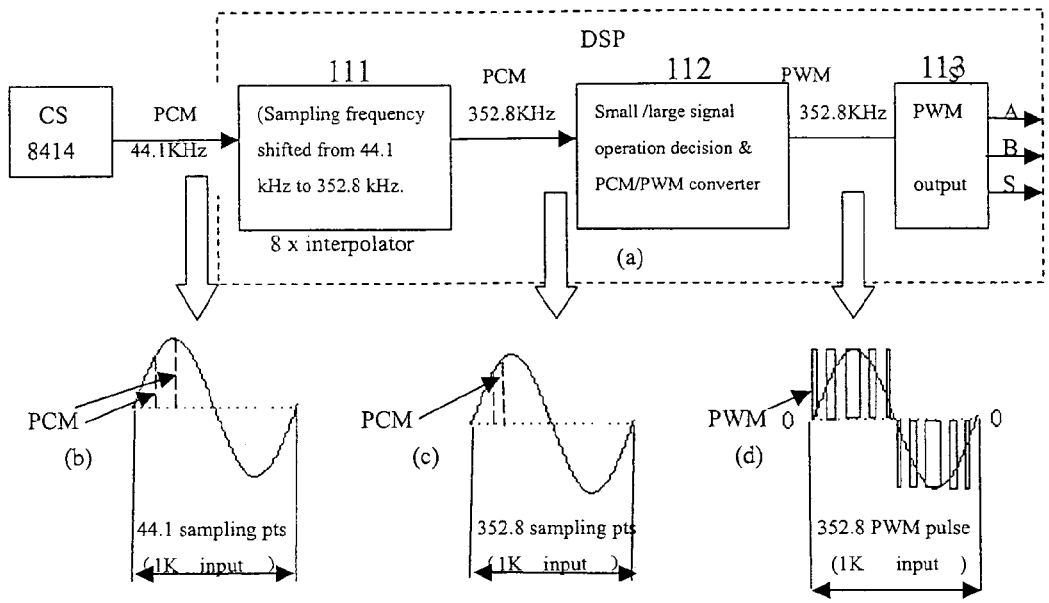
FIG. 3 shows in further detail the DSP block of the amplifier of FIG. 1 and the associated digital signal transitioning through the various signal blocks in the DSP block, FIGS. 4a and 4b respectively show the equivalent circuits of a H-bridge difference amplifier under a first operating mode (at a higher supply voltage) and a second operating mode (at a lower operating voltage) as an example of a suitable difference amplifier suitable for use in the present invention, FIGS. 5a and 5b respectively show some typical pulse forms of signal branches A, B and the difference of signals of branches B and A respectively in to the first and second operating modes.

Referring to FIGS. 1 to 3, the amplifier 1 includes a front-end stage 100 and a power amplifier stage 200. The front-end stage includes a digital signal processor (DSP) 110. The power amplification stage 200 includes drive logic 210 and a difference amplifier 220. A MOSFET bridge or H-bridge difference amplifier is used as an example to assist discussion in the present embodiment. The DSP 110 includes a 8× interpolator so that incoming PCM signals at 44.1 KHz will be interpolated to an elevated sampling frequency of 352.8 KHz. The interpolated PCM are then fed to a control means 112 which includes decision circuitry and a PCM/PWM converter. The PCM/PWM converter converts incoming PCM data to digital PWM data. The decision circuitry includes means to evaluate the characteristics of the incoming PCM signal and to generate an operating mode indicator S according to pre-determined criteria on the incoming signal characteristics to be explained below. The converted PWM signal at 352.8 KHz is then forwarded to the output stage 113 which includes a first signal output branch A and a second output branch B which are adapted to produce PWM output by signal differencing between the two branches, as shown by the signal waveform diagrams of FIGS. 5a and 5b. The output stage 113 also outputs the operating mode indicator S for controlling the drive logic 210.

Referring to FIG. 2, the drive logic 210 includes input nodes for receiving signals from branches A and B and output nodes for connecting to the subsequent power MOSFET bridge amplifier 220. The drive logic 210 includes a signal transmission circuit for each of the branches A and B. Each signal transmission circuit includes a through connection and a path with an inverter 211, 212 so that both the original and the inverted signal will be available at the output of the drive logic. A two-way switch 213, 214 is connected to the inverting path. The switching positions of the two-way switches 213, 214 are determined by the value of the operating mode indicator S as well as the instantaneous operating modes of the MOSFET bridge amplifier 220 to be explained below.

In the present example, the Lo and Hi values of the operating mode indicator, that is, S=0 and 1, correspond respectively to large- and small-signal amplification modes of the bridge amplifier 220. When S=0 (Lo), the two-way switches 213, 214 are connected to positions P1G, P3G for sending incoming signals to the amplifying stage with the higher operating voltage VH. When S=1 (Hi), the two-way switches 213, 214 will make connection with the terminals P2G and P4G so that signals from branches A and B will be fed into the amplifying branch with a lower operating voltage VL.

The MOSFET amplifying bridge 220 includes first 221 and second 222 parallelly connected H- or bridge-type MOSFET amplifying bridge which are connected for alternative operation. The first alternative bridge-type MOSFET amplifying bridge 221 is connected to a higher voltage supply VH and includes a first amplifying arm and a second amplifying arm. The first amplifying arm includes MOSFETs TP1 and TN1. The second amplifying arm includes MOSFETs TP3 and TN2. The second alternative bridge-type difference amplifier 222 also includes a first and a second amplifying arms which are connected to a lower voltage supply VL. The first amplifying arm of the second alternative amplifying bridge includes MOSFETs TP2 and TN1 while the second amplifying arm includes MOSFETs TP4 and TN2. The operation of the bridge type amplifier will be briefly explained below.

Assuming for the sake of example that S=0, when signal A is high, TN1 conducts and TP1 is blocked. Output A1 will be pulled to ground and the output voltage is Lo or substantially zero. When the signal level of A is Lo, TN1 is blocked and TP1 conducts. As a result, output A1 will have a high output at or near VH. The operation of the B signal branch is generally the same. Hence, outputs A1 and B1 are respectively inversion of signal branches A and B. The signal difference between A1 and B1 is the PWM output pulse of the bridge differencing amplifier and is equal to $V_{A1}-V_{B1}$. In the description below, the term PWM output pulse or equivalent refers to the pulse output which is obtained by difference between signal branches A1 and B1 unless the context otherwise requires. Also, it will be noted without loss of generality that the voltage output of a PWM pulse is related to the pulse width or pulse area of the pulse and that the output voltage is proportional to the duty cycle of the pulse.

Figure 4A:
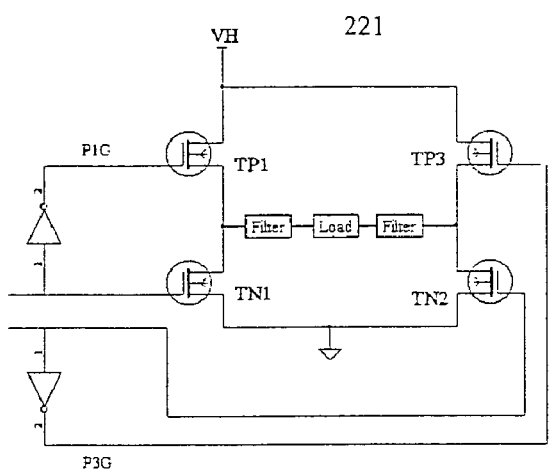
Figure 4B:
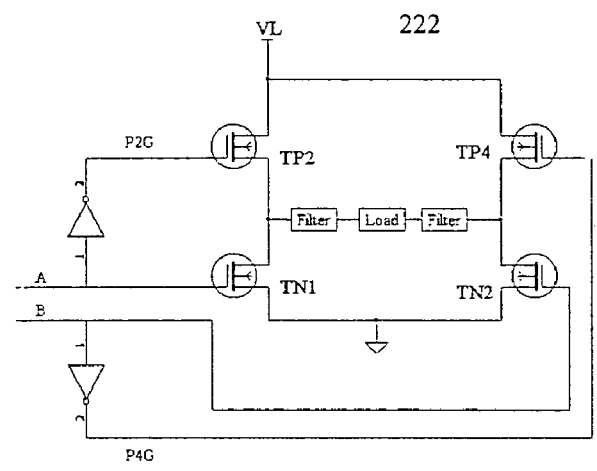

Equivalent circuits of the MOSFET amplifier 220 under the alternative supply voltages VH and VL are shown in FIGS. 4*a* and 4*b*. At the output A1 and B1, the output pulses are integrated by an integrator or a low pass filter and the difference between the integrated outputs represents the instantaneous energy to the load.

Figures 5A, 5B:
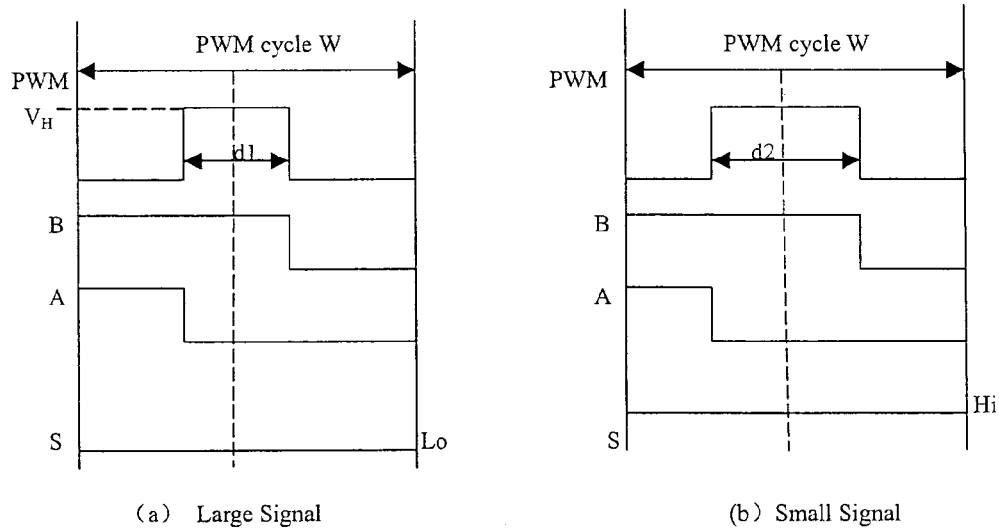

An example of waveform relationships between the signals S, A and B for a PWM pulse with cycle width W are shown in FIGS. 5*a* and 5*b*. For a typical PWM output pulse with pulse width d1 utilizing a typical H-bridge type or difference amplifier, a PWM output pulse with a pulse width $d_1$ which is substantially symmetrical about the centreline of the PWM cycle is typically generated by signal difference between the branches B and A. The typical pulse width in branches B and A for generating a PWM output pulse with pulse width $d_1$ is respectively $(W+d_1)/2$ and $(W-d_1)/2$ and that for a pulse width of $d_2$ is $(W\pm d_2)/2$. FIGS. 5*a* and 5*b* correspond respectively to the large and small signal amplification modes and the S values respectively equal to 0 and 1. Although PWM output pulses with characteristic pulse widths $d_1$ and $d_2$ which are symmetrical about the cycle centreline are used in this example, this choice is merely for convenience and it should be appreciated by persons skilled in the art that other appropriate PWM pulses, whether or not symmetrical about the PWM cycle centreline, can be used without loss of generality.

FIG. 9 shows an example of signal waveforms from a signal source with a wide variation of signal amplitudes to assist understanding of the invention. The signals of FIG. 9 include regions of large signals with peak amplitude M and small signals with peak amplitude N. FIG. 9*a* shows sampling of the signal of waveform so that sampled data of the signal of FIG. 9 can be converted into a digital format for subsequent input to the front end 100. The sampled data can be in, for example, the I²S (RTM) format which is widely used in the industry before converting into the PCM signal. Of course, direct digital signal of other signal formats, such as PCM, PWM or other digital signals from digital medium sources such as CD, VCD, DVD, can be fed into the DSP or other appropriate input of the amplifier without loss of generality.

It is known that high-power PWM amplifiers require a relatively large voltage difference between the input and the output signals. However, as the voltage difference increases, precise controlling of small-valued output signals become increasingly difficult because of the relatively short pulse widths for representing the small signals which may result in excessive timing errors, noise corruption and signal distortion. To alleviate this problem so that the resolution can be enhanced without adversely affecting the dynamic range, a bridge amplifier with alternative amplifying sections connected to a higher voltage supply and a lower voltage supply is proposed. In fact, experiments show that the schemes and methods of this invention improve resolution as well as dynamic range.

The use of an amplifier with different supply voltages enables selective amplification of the signals according to their signal characteristics so that smaller signals can be amplified under a lower supply voltage and larger signals can be amplified by operating the amplifying circuitry under a higher supply voltage.

On the other hand, it is observed that when the outputs $A_1$ and $B_1$ are connected to a typical load 230, such as a loudspeaker, oscillation or other instabilities are frequently observed due to switching between the alternative operating modes at different supply voltages. In this regard, it is noted that a typical load to a PWM output usually includes a signal integrator or a low pass filter. A typical low pass filter for typical application typically includes a serially connected indicator L2 and a parallelly connected capacitor C2.

Upon more detailed study of the circuit oscillation and instability, it was noted that abrupt voltage changes or voltage non-continuities at the low-passed output nodes $A_2$ and $B_2$, which are intermediate of L1 and C1 and L2 and C2, are a major contributing factor to the problems.

To alleviate the problems associated with voltage switching of a difference amplifier having alternative branches and difference supply voltages, a transition operating scheme or mode is proposed so that the PWM bridge amplifier will progress through a transitional phase before changing its operation modes or voltages.

In the specification below, the first and second operating modes of the bridge amplifier respectively refer to operation of the amplifier branches at the higher (VH) and the lower (VL) voltages for convenience.

Figure 6:
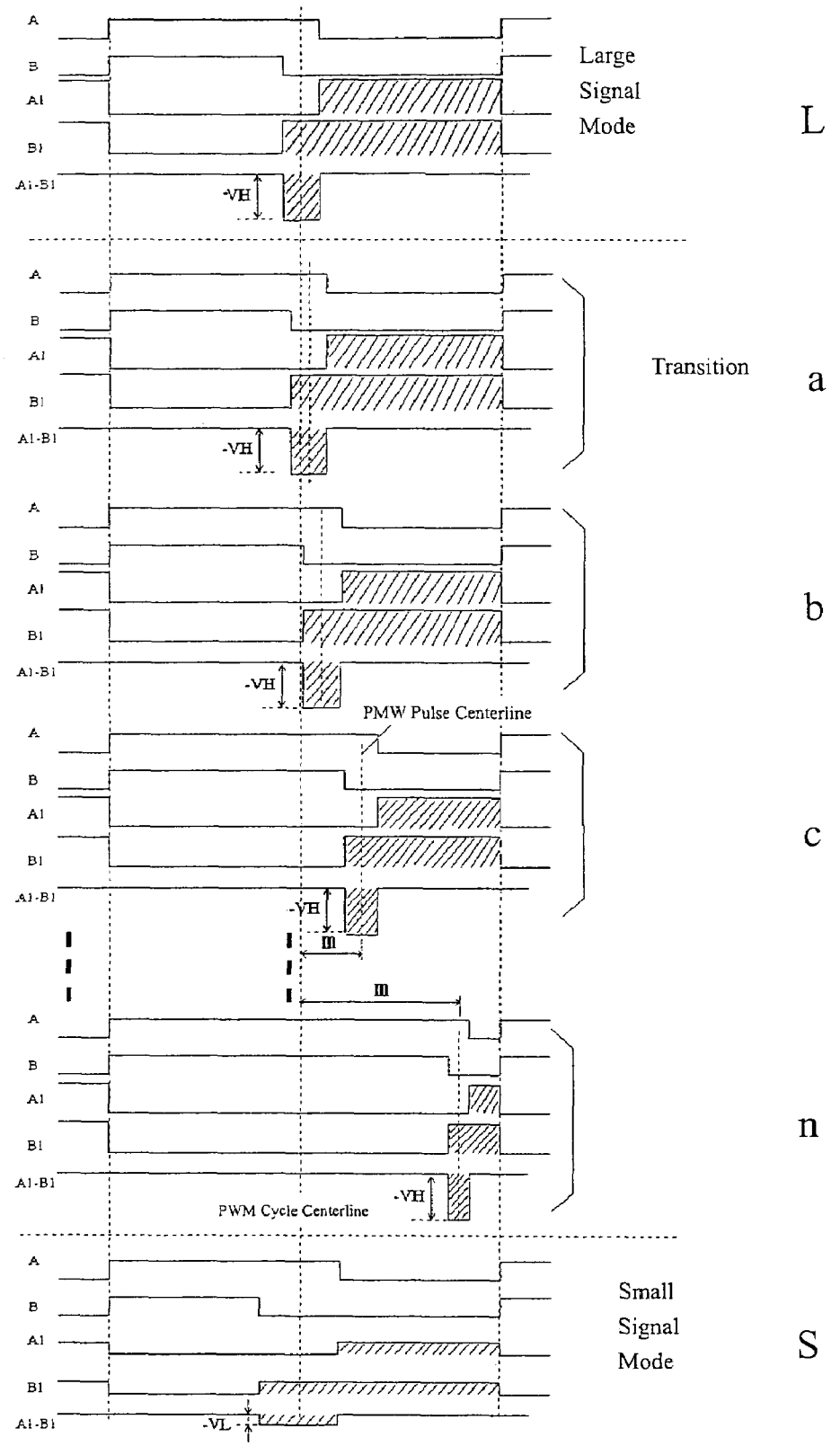
FIG. 6 shows an example of waveform transition from the first operating mode (large signal amplification mode) to the second operating mode (small signal amplification mode) in the difference amplifier employing signal processing schemes of a first preferred embodiment of the present invention.

Referring to FIG. 6, there are shown various stages of related signal waveforms during transition from the first operating mode (L) to the second operating mode (S) as an example. Initially, the amplifier is operating in its first operating mode (L) with S=0. Signal branches A and B from the DSP are respectively fed into the first and the second amplifying arms of the amplifying bridges. It will be noted that the pulse widths of the pulses from branches A and B are respectively (W+d)/2 and (W−d)/2, where d is the pulse of the desired PWM output pulse. Inverted signals from branches A and B are respectively connected to nodes P1G and P3G. In this first operating mode, VH is the operating voltage and VL is severed from the second amplifier branch. Thus, TP1, TN1, TP3 and TN2 are the active operating components of the amplifier in this first operating mode as shown in FIG. 4a.

At this instant, incoming signals have entered into the small signal region and amplification by the second operating mode is preferred to enhance signal fidelity. The amplifier will be switched from its first operating mode into its second operating mode. When such a decision has been made by the decision circuitry of block 112, the operating mode indicator or flags S will be changed from 0 (large signal amplification) to 1 (small signal modification). Upon detection of this change, for example, by edge transition detection, the amplifier will move from its first operating mode, as shown in step L, to the second operating mode, as shown in step S of FIG. 6.

Assuming the gain factor of the amplifier remains constant and since the incoming signal is expected to have a substantially degree of continuity, a continuity of energy output by the PWM pulses immediately before and after the change of operating modes can be expected. As the voltage or energy content of a PWM pulse is related to its pulse area, substantial continuity in the PWM pulse areas immediately before and after the change of operating modes will also be expected.

On the other hand, as there is no change in the PWM frequency and the cycle width will remain unchanged as W, the change from the first operating mode at a higher operating voltage to the second operating mode at a lower voltage while maintaining pulse area continuity will mean that the PWM pulse will be broadened from $d_1$ to $d_2$ as a result of the change. As the PWM pulse output is constituted by pulse width differences between the pulse outputs of signal branches A1 and B1, the pulse width of B1 immediately before and after the change of operating modes is respectively (W+$d_1$)/2 and (W+$d_2$)/2. Likewise, the pulse width of A1 before and after the change is respectively (W−$d_1$)/2 and (W−$d_2$)/2, wherein d1 and d2 are the respective PWM output pulse width before and after the change.

Furthermore, as the pulse broadening will be substantially proportional to the ratio K=VH/VL, to maintain pulse area continuity before and after operating voltage change, pulse broadening on the branches A and B will be more significant for a large K.

The pulse area of the longer pulse B1 before and after the operating voltage change is respectively (W+$d_1$)VH/2 and (W+$d_2$)VL/2. If there is pulse area continuity in the signal branch B1, it will follow that (W+$d_1$)VH/2=(W+$d_2$)VL/2. Hence, K(W+$d_1$)=(W+$d_2$) and, therefore, (K−1)W+K$d_1$=$d_2$, where K=VH/VL as defined before. As $d_2$ must be less that W, it follows that (K−1)W+K$d_1$=$d_2$≦W and $d_1$≦W(2/K−1). Thus, discontinuity of pulse area can be expected in the signal branch B1 due to change in operating voltage for K>2.

Likewise, as signal branch A1 is an inversion of its input A, the same discontinuity will occur in signal branch A for K>2.

Furthermore, it will be noted that the higher the ratio K, the more abrupt will be the change of the area of signal branch B1. This change in the area of the pulses of A1 and B1 also means that the pulse area of the output branches A1 and B1 will change abruptly from that of step L to step S and such an abrupt transition of pulse area before and after the change of operating modes has been found to have contributed to circuit oscillation and instability, especially at the capacitors C1 and C2 of the load.

To alleviate this problem, a transition scheme is proposed in the present invention.

Assuming that the PWM output pulse width at step L is $d_1$ and the PWM output pulse is symmetrical about the PWM cycle centreline, the pulse width of the pulses at the outputs A1 and B1 will be respectively (W−$d_1$)/2 and (W+$d_1$)/2. To alleviate the problems associated with the abrupt change of the pulse areas of the outputs A1 and B1 due to the change of operating modes, the amplifier will undergo a transition mode before there is a change of operating modes.

In this connection, it will be appreciated that while the amplitude of the incoming signal (and hence the corresponding PWM output pulse width) is expected to be constantly changing, there will be a substantial degree of signal amplitude continuity and therefore the PWM output pulse width continuity before and after the transition by using a PWM sampling frequency which is much higher than the signal frequency. For example, for the present example as a PWM amplifier for audio signals, the signal frequency is within the normal range of 20–24 kHz while the sampling frequency is set to 352.8 kHz. Thus, $d_2$ can be assumed to be substantially identical to $Kd_1$(K≧1) without loss of generality.

It will be noted that the pulse area of output A1 before and after the change of operating modes will be respectively (W−$d_1$)VH/2 and (W−$d_2$)VL/2, where $d_1$ and $d_2$ are respectively the pulse widths before and after the change of operating modes and $d_2$=$Kd_1$(K≧1). The pulse area difference is an reduction of pulse area $\Delta_1$=(K−1)WVL/2, assuming without loss of generality that there is substantial continuity of the width of the PWM pulses immediately before and after the change of operating modes. Likewise, the change of pulse area of B1 is also reduced by (K−1)WVL/2. The higher the value of K, the more abrupt is the change. To alleviate this abrupt change of areas of A1 and B1, the pulse areas of A1 and B1 are gradually changed towards the pulse area of A1 and B1 in step S of FIG. 6 as shown by the steps a–n.

Referring to FIG. 6, when the amplifier is operating in the first operating mode under the large signal amplification mode and S is now changed to 1, the amplifier will move into the transition mode by progressively changing the pulse widths of the pulses of the outputs A1 and B1. As can be seen from steps a to n, the A1, B1 pulses are gradually narrowed while maintaining the correct PWM output so that the output PWM pulse area would not be affected by the transition. During the transition, the pulse widths of the outputs of A1 and B1 are gradually reduced by an amount m until the resulting pulse area of pulse outputs A1 and B1 are comparable to that of the pulse widths of A1 and B1 after the change of operating mode at which point the transition is completed. The value of m is gradually increased so that the pulse widths of A1 and B1 are gradually reduced to provide a smooth transition. Table 1 below sets the relationship between the various pulses during the normal operating modes and transition from the first operating mode to the second operating mode.

| | A | B | A1 | B1 |
|---|---|---|---|---|
| Normal operation | W/2 − d1/2 | W/2 + d1/2 | W/2 + d1/2 | W/2 − d1/2 |
| Large to Small Transition | W/2 − d1/2 + m | W/2 + d1/2 + m | W/2 + d1/2 − m | W/2 − d1/2 − m |
| Small to Large Transition | W/2 − d1/2 + m | W/2 + d1/2 + m | W/2 + d1/2 − m | W/2 − d1/2 − m |

Figure 7:
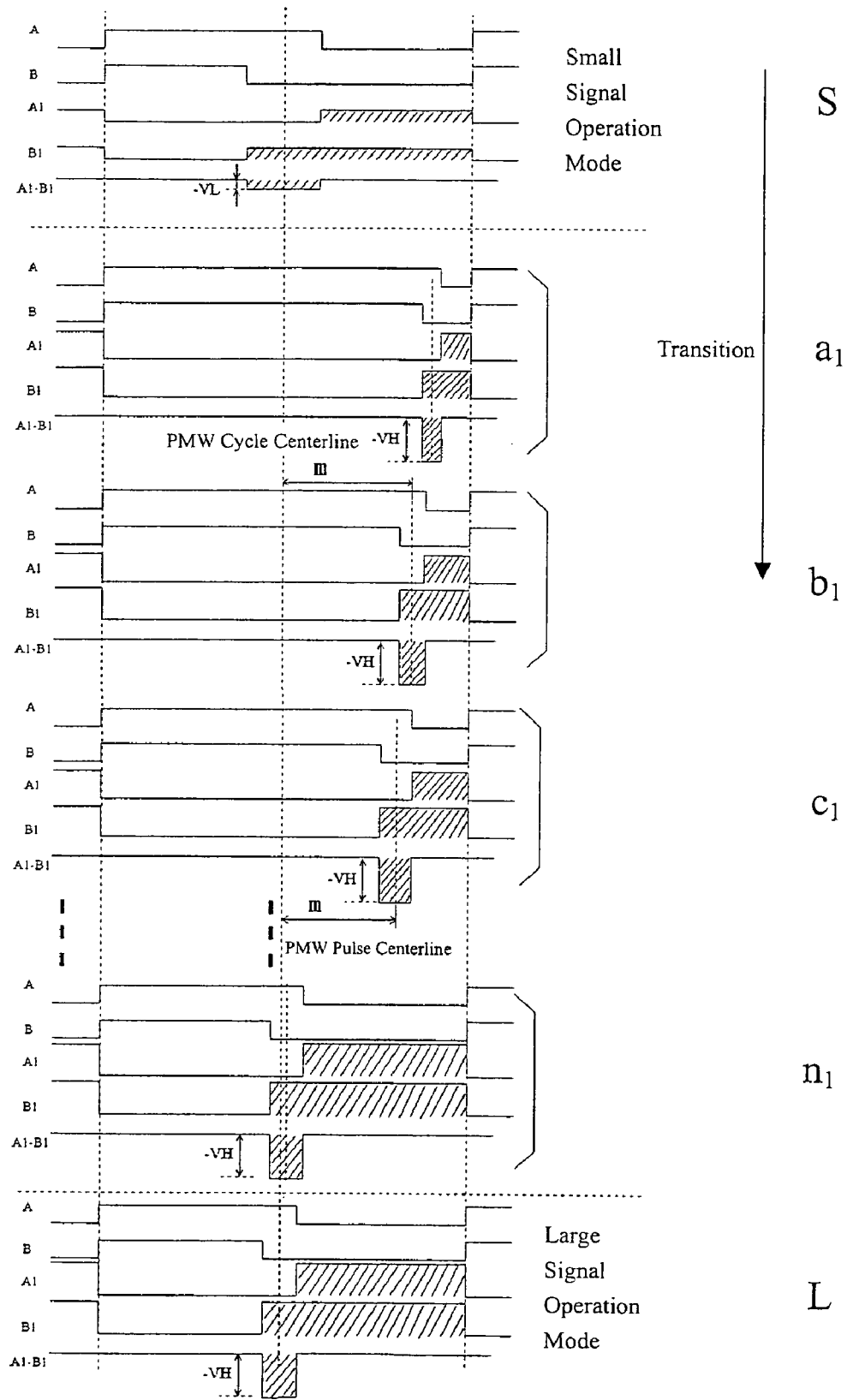
FIG. 7 shows an example of waveform transition from the second operating mode (small signal amplification mode) to the first operating mode (large signal amplification mode) in the difference amplifier employing signal processing schemes of a first preferred embodiment of the present invention.
Figure 8:
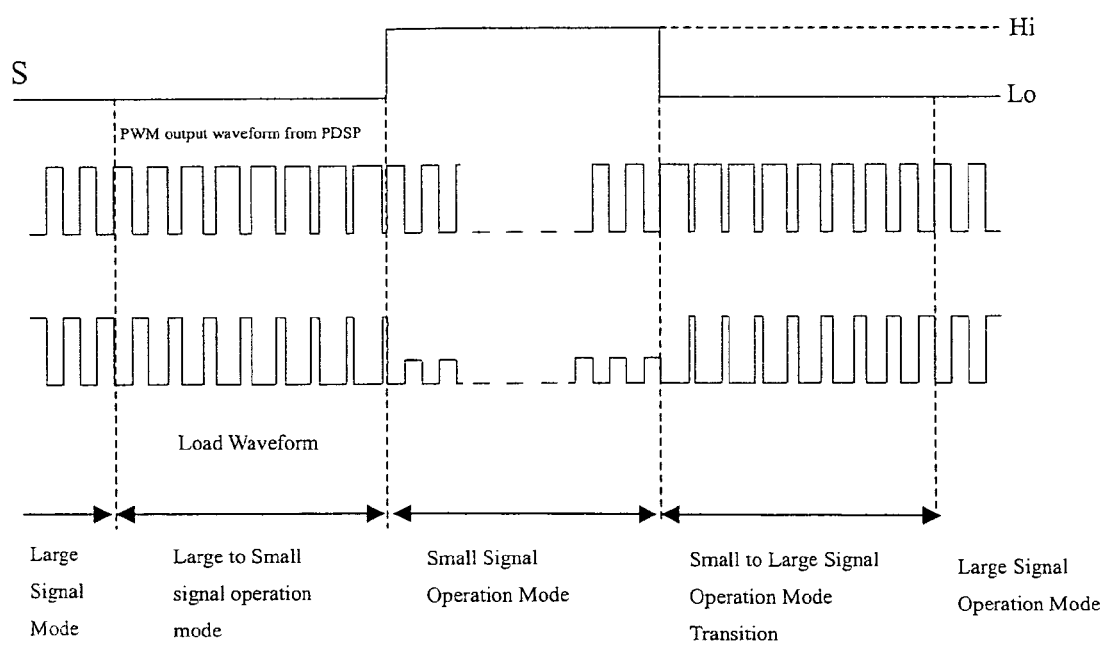
FIG. 8 is a schematic diagram showing an overview of signals at the DSP output, at the load and the transition signals during transition between the first operating mode and the second operating mode of the difference amplifier with reference to the DSP output and the transition signal S.

It will be noted that m will be gradually increasing in "Large to Small Transition" while m will be gradually decreasing from Small to Large Transition, as shown in FIGS. 6 and 7.

Next, assuming that the amplifier is in its second operating mode and the operating mode indicating flag is changed from 1 to 0 so that the first operating mode is preferred. During the second operating mode, VL is the supply voltage and incoming signal streams A and B from the DSP are fed to the input nodes P2G and P4G so that MOSFET TP2, TP4, TN1 and TN2 are responsible for signal amplification.

Assuming without loss of generality that the PWM pulse output, which is the difference of the output pulses of A1 and B1, is symmetrical about the centreline of the PWM cycle with cycle width W and pulse width $d_2$. At this instant, outputs B1 and A1 respectively have a pulse width of $(W \pm d_2)/2$ and their respective area is $(W \pm d_2)VL/2$ with the PWM output pulse area being $d_2 VL$. As signal continuity can be expected, the PWM output pulse area $d_2 VL$ will be expected to be equal to the pulse area $d_1 VH$ after change of operating mode. Hence, $d_1 = d_2/K$ where K is the ratio VH/VL. Similarly, to provide a PWM pulse output with pulse width $d_1$, the pulse width of the outputs B1 and A1 are respectively is $(W \pm d_1)/2$ and their respective area is $(W \pm d_2) VL/2$. As $d_2 VL = d_1 VH$, that is, $d_2 = K d_1$ for PWM pulse continuity, the difference in pulse area in the pulses of A1 and B1 before and after the transition is also equal to $(K-1)WVL/2$. To alleviate adverse influence due to the abrupt increase of the pulse areas of signal branches A1 and B1, the pulse widths of the outputs A1 and B1 are gradually increased during the transition period while maintaining the correct PWM output pulse width as shown by the various transitional waveforms in FIG. 7. During the transition, the pulse widths of the outputs A1 and B1 are respectively $(W \pm d)/2 + m$, where m represents a variable dummy pulse width which is gradually decreased during the transition from the second operating mode to the first operating mode, that is, during the Small to Large Transition.

Figure 10:
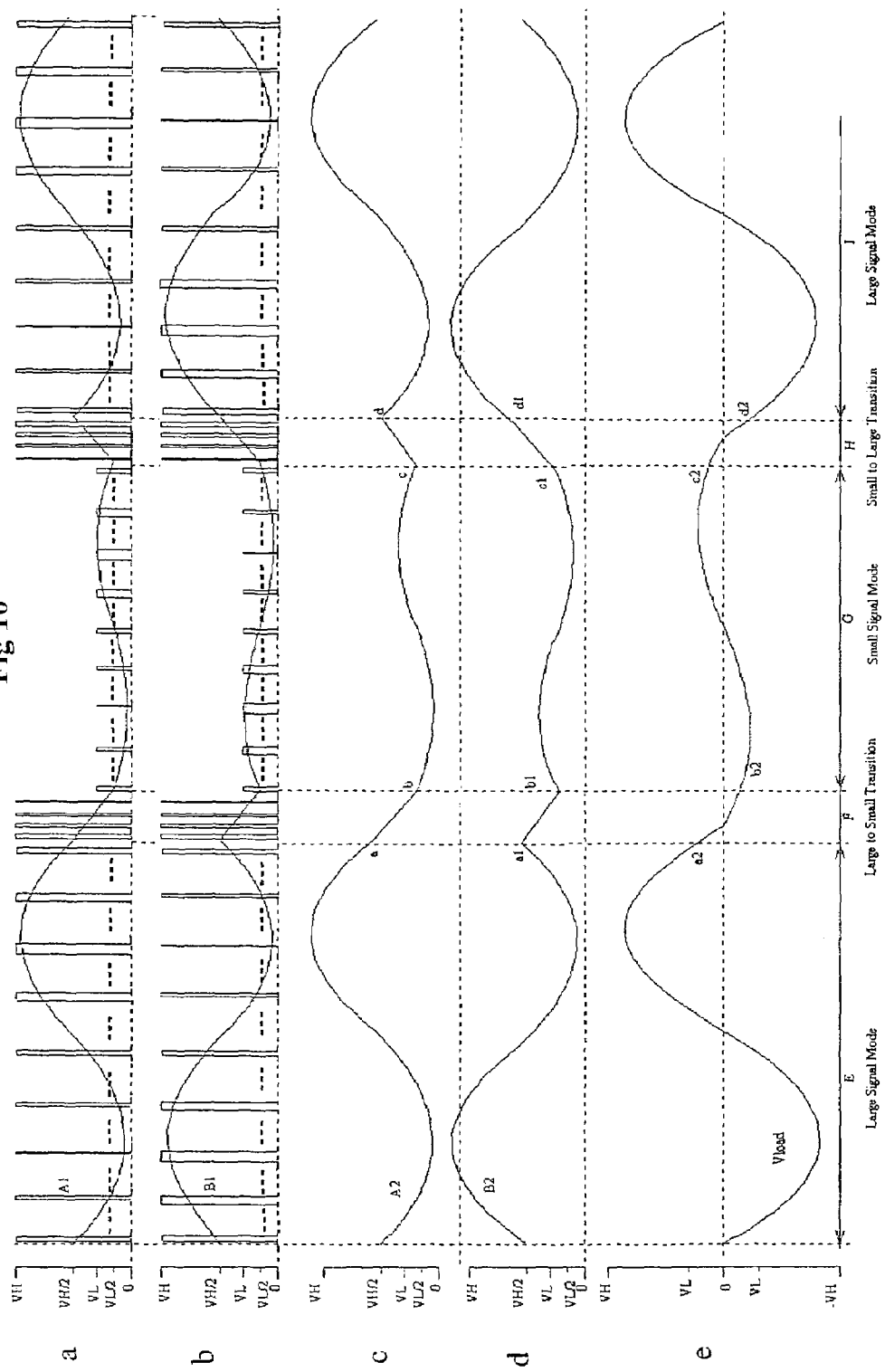
FIGS. 10a, b, c, d and e respectively show an example of corresponding waveforms at the output of the amplifying stage 220, at the integrated output A2, B2 and the load.

FIG. 10 shows an example waveform across the load (A2-B2) and the component waveforms A2 and B2 during an example operation phases of the amplifiers. Referring to the Figure, in regions E and I, the amplifier operates in the first operating mode. In region G, the amplifier operates in the second operating mode. In region F, the amplifier prepares for transition from the first operating mode to the second operating mode. It will be observed from graph e) that during the transition region F, there is a continuity of the load voltage between a2 and b2 while there are discontinuity between the end points a, b and a1, b1 but for the transition continuity provided by the transitional pulse narrowing of outputs A1 and B1 discussed above. Similarly, continuity between the abrupt change of voltages at the end points c, d and c1, d1 during the transition from the second operating mode to the first operating mode are substantially provided by the transitional pulse with broadening of outputs A1 and B1 to alleviate the circuit instability or oscillations observed.

Furthermore, during transition from the second operating mode to the first operating mode, the amplifier operates with the higher voltage supply VH.

The switching of supply voltage to VH during transition from the second operating to the first operating mode is preferred to provide added flexibility to the extent of possible pulse width adjustment of A1 and B1 which will become more apparent from the example below.

For example, assuming for the sake of convenience that the DSP clock frequency is 150 MHz so that the minimum clock period is 6.7 ns and the maximum pulse width of a PWM cycle will be 2834 ns/6.7 ns=425. Assuming that 400 is the maximum number of cycles and the PWM output pulse width at the first operating mode is 20, the pulse widths of A1 and B1 are respectively (425/2−10)=202 and (425/2+10)=222. If VH/VL=K=10 and, if VL is the operating voltage during the transition from the first operating mode to the second operating mode, pulse widths of signal branches A1 and B1 will be changed respectively to 2020 and 2220 so that the PWM pulse width is 200. Hence, the pulse width of A1 and B1 is higher than the maximum pulse width available. On the other hand, if K is smaller than 2, then the amplifier operating voltage during the transition will be at a lower supply voltage.

Referring to FIGS. 9 and 9*a*, in order to alleviate unnecessary or undesirable over-frequent switching between operating modes, the decision to switch from the first operating mode to the second operating mode will depend on additional criteria in addition to the amplitudes. In the present example, the DSP will generate the switching or transition signal, that is, to change the operating mode indicator S from 0 to 1, when a pre-determined number of sample below a certain pre-determined amplitude have been detected so that switching of operating voltages will only occur in the real small signal region and not in a large signal region Y, even though the instantaneous amplitude of the individual sample may fall within the threshold limit of the amplitude Z.

It will be noted from FIGS. 11*a*–13 that another form of PWM pulse format which are also appropriate for use in the application and the transition operating modes will be noted.

Figure 11A:
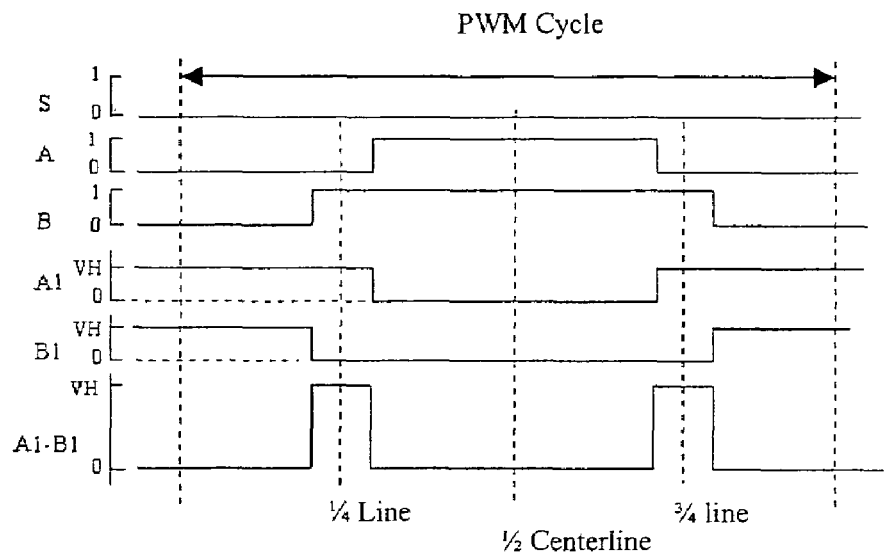
FIGS. 11a and 11b respectively show PWM waveforms of a second preferred embodiment suitable for use with the amplifier of the present invention.
Figure 11B:
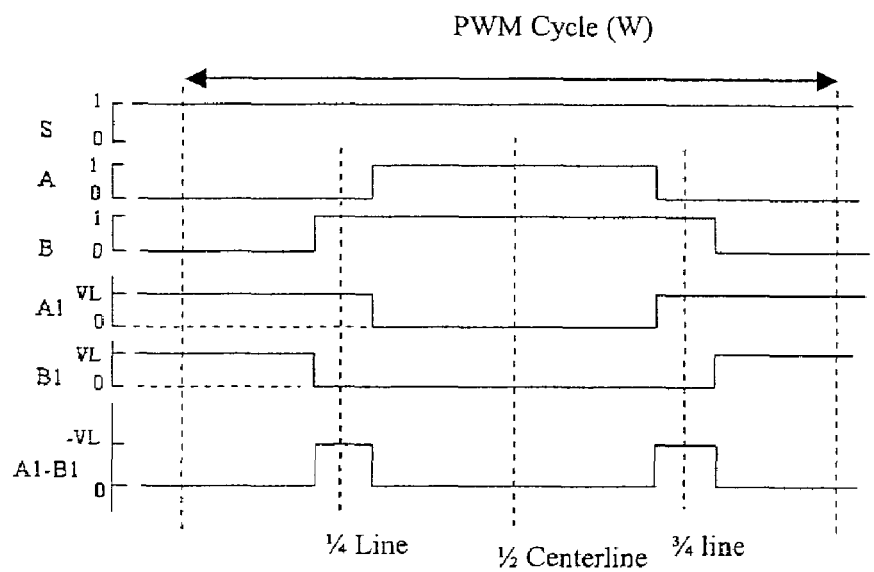

Referring to FIGS. 11*a* and 11*b*, it will be noted that the PWM output pulse (A1-B1) is composed by signal branches A and B. The pulse shape of the signal branches A and B are substantially symmetrical about the centreline of the PWM cycle W with different pulse width so that the resulting PWM output pulse (A1-B1) comprises two pulses which are disposed symmetrically about the centreline. In order to ensure continuity in the pulse areas of A, B, A1, B1 and A1-B1 before and after supply voltage changes, a transitional pulse shaping technique is also utilized. Furthermore, as the voltages of the pulses A, B, A1, B1 and A1-B1 are directly proportional to their pulse area, voltage continuity along the branches A and B is also expected.

Figure 12:
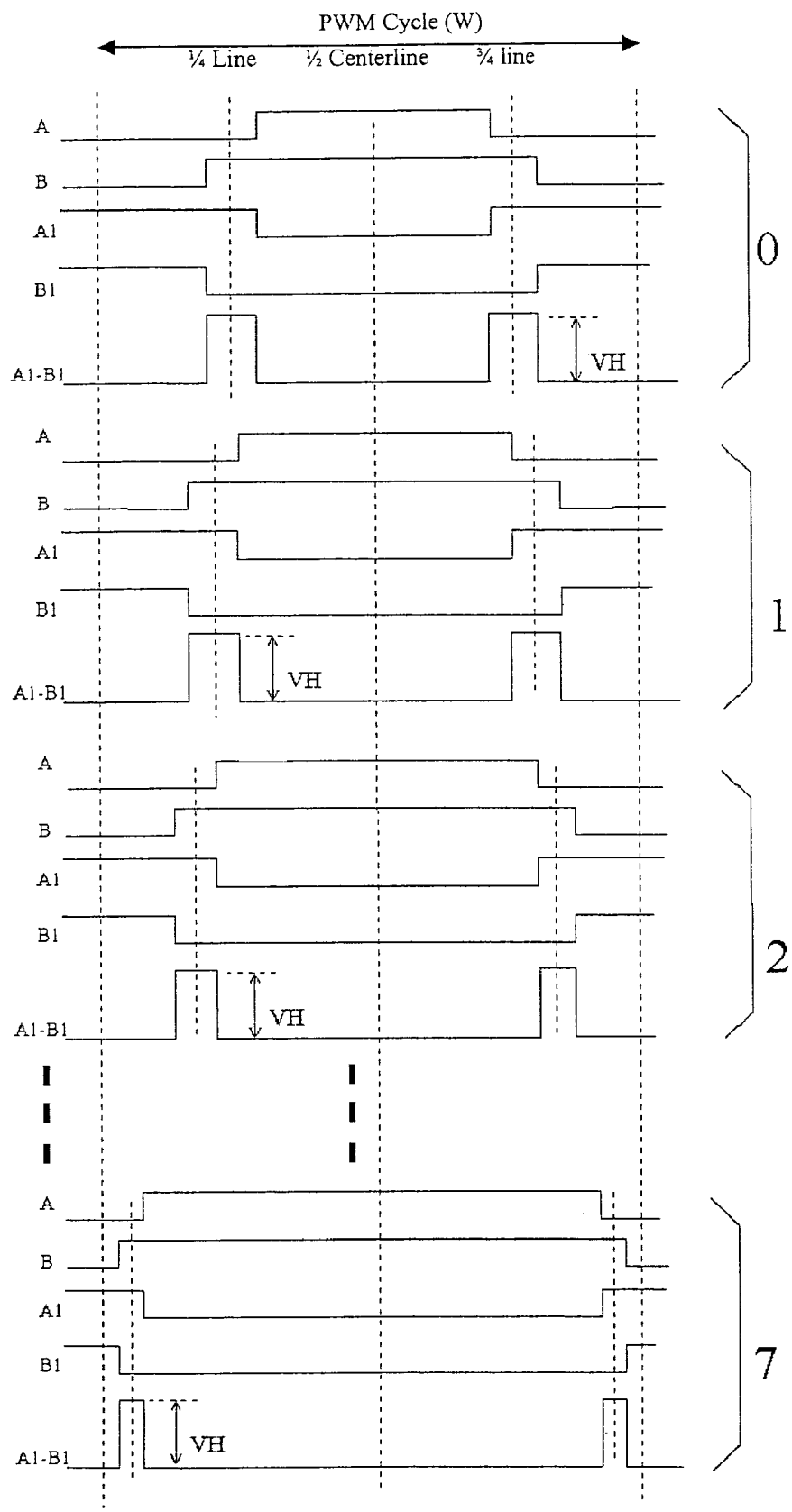
FIG. 12 shows the waveform transition between the first operating mode and the second operating mode in the difference amplifier with respect to a second preferred form of PWM signal of FIGS. 11a and 11b.

Referring to FIG. 12, the various waveform sets show the transition from the first operating mode (high operating voltage) to the second operating mode (low operating voltage) of the amplifiers. In the transition from the first operating mode to the second operating mode, in order to maintain the various pulse area continuity, the pulse widths of signal branches A1 and B1 are gradually narrowed, as shown by the transitional phases 1–7 of FIG. 12, until the pulse areas of signal branches A1 and B1 are comparable to the corresponding pulse areas after switching of operating voltages with the lower supply voltage. Since A1 and B1 are inversion of A and B, it will be noted that A and B are gradually broadened during the transition.

Figure 13:
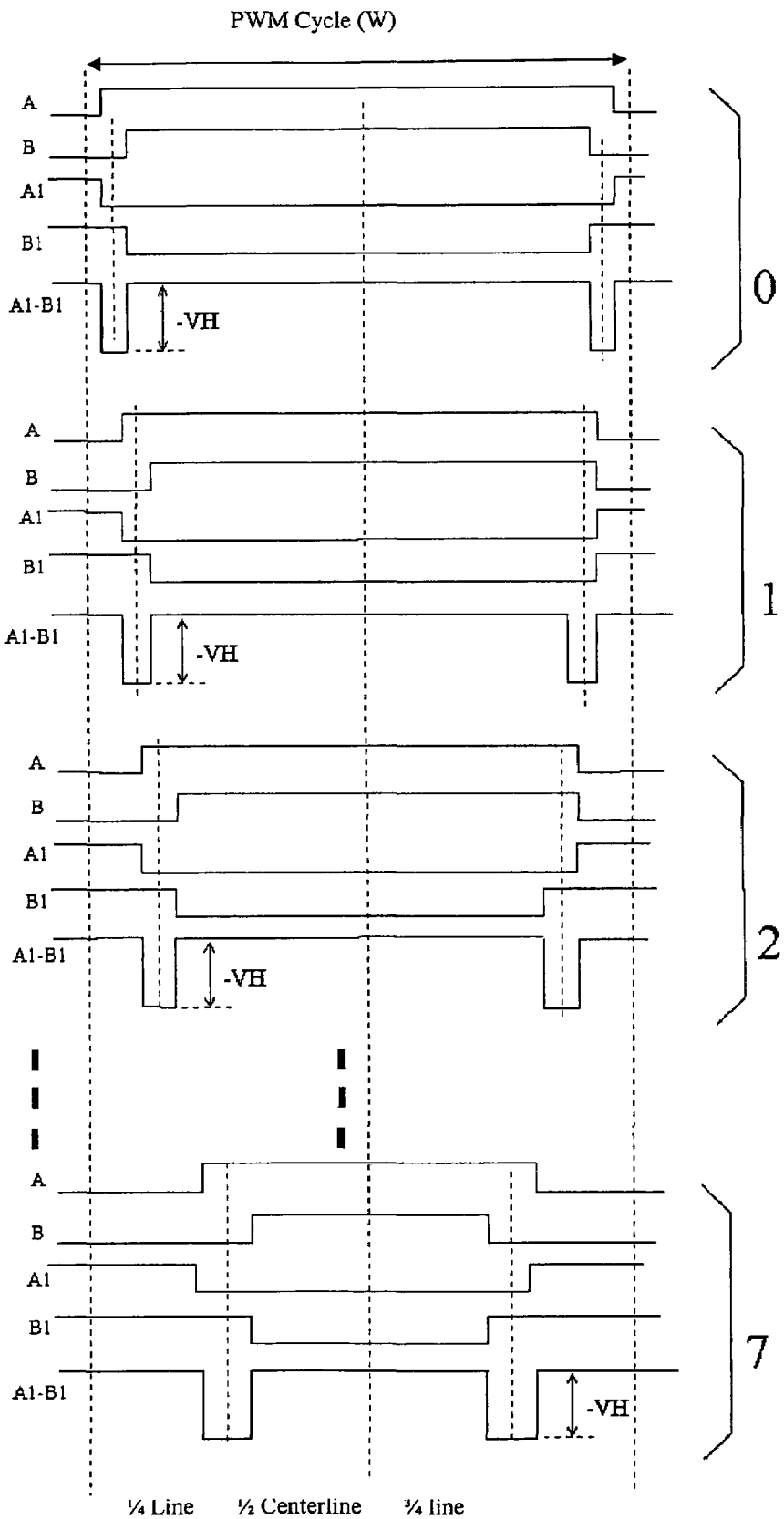
FIG. 13 shows the waveform transition between the second operating mode and the first operating mode of the difference amplifier with respect to the PWM signal of FIGS. 11a and 11b.

Referring to FIG. 13, the transition from the second operating mode to the first operating mode is shown. In this transition, it will be noted that the pulse width of the signal branches A1 and B1 are gradually increased to prepare for the transition.

It will be appreciated from the above examples that, by appropriately utilizing the technique of conversion pulse between signal pulses having a large voltage amplitude and a narrow time spread and signal pulses having a low voltage amplitude and a wide time spread during the amplification process, digital amplification having a high dynamic range as well as a high resolution can be obtained. For example, using a DSP having an output frequency of 150 MHz as an example again, the signal pulse output by the DSP will have a minimum pulse width of 6.67 ns. By switching the amplifier between a high voltage state VH and a low voltage state VL having the relationship VH/VL=10, since the signal pulses will have the same pulse area, a small signal having a signal time base of 6.67 ns will be converted to become a pulse of 0.667 ns wide under the large signal operation having a voltage amplitude VH. Assuming that the PWM frequency is 352.8 Kz, the maximum PWM pulse will have a time spread of 2834 ns. By utilizing a large signal pulse having a narrow signal width, the resolution will be enhanced by 10 dB.

In the present examples, such a technique has been exemplified by way of a digital amplifier including a higher voltage amplifying branch, a lower voltage amplifying branch, digital signal processing means, control means for selectively amplifying a digital signal alternatively by said higher voltage amplifier branch or said lower voltage amplifying branch for output and for controlling the transition between amplification by said higher voltage amplifier branch and said low voltage amplifier branch, conversion means for converting a digital signal for amplification between said higher voltage amplifying branch and said lower voltage amplifying branch upon detection of a transition signal, wherein, during said transition between amplification by said higher voltage amplifier branch and said lower voltage amplifier branch, the effective pulse area of the digital signal to be amplified by either said higher voltage amplifying branch and said lower voltage amplifying branch remains substantially unchanged.

While the present invention has been explained by reference to a fully digital amplifier, it should be appreciated that the invention can apply, whether with or without modifications, to other PWM type or like amplifiers or other amplifiers without loss of generality. Of course, amplifying schemes, devices and apparatus described above can be incorporated in a pure digital amplifier or a hybrid amplifier including analogue and digital amplifying stages. Furthermore, while the present invention has been explained with reference to an amplifier including an amplifying stage with two amplifying bridges operating at two different supply voltages, it will be appreciated the amplifying stage may include a plurality of alternative difference amplifying branches operating at a plurality of alternative operating voltages without loss of generality.

While the present invention has been explained by reference to the preferred embodiments described above, it will be appreciated that the embodiments are only provided and illustrated as examples to assist understanding of the present invention and are not meant to restrict or limit the scope of this invention. In particular, the scope and ambit of this invention are to be determined from the general principles taught in this specification with reference to and as inferred or exemplified by the embodiments described above. More particularly, variations or modifications which are obvious or trivial to persons skilled in the art, as well as improvements made on the basis of the present invention, would of course within the scope and boundary of the present invention.

The invention claimed is:

1. An amplifier including a difference amplifier, said difference amplifier including a first output and a second output which are adapted for providing a PWM signal output to a load by signal difference between said first and said second outputs, said difference amplifier being adapted for operating in at least first and second alternative operating modes which are respectively characterised by first and second operating voltages, wherein during transition from one operating mode to another, the pulse area of the pulses of said first and second outputs of said difference amplifier are changed according to a pre-determined manner so that the pulse area of pulses of said first and second outputs at the end of said transitional mode is equivalent to the pulse area of the pulses of said first and second outputs immediately after the change of operating modes.

2. An amplifier according to claim 1, wherein the pulse area of the pulses of said first and said second outputs are gradually changed during said transition by changing their pulse width so that there is a substantial continuity of the relevant pulse area of the pulses at the end of said transition mode and immediately after change of operating modes is substantially equal.

3. An amplifier according to claim 1, wherein the pulse area of the pulses of said first and said second outputs are gradually changed during said transition by changing their pulse width so that the relevant pulse area of the pulses at the end of said transition mode and immediately after change of operating modes is substantially equal.

4. An amplifier according to claim 1, wherein said first operating voltage being higher than said second operating voltage, wherein, during transition from said first operating mode to said second operating mode, the pulse area of pulses of said first and second outputs of said difference amplifier being gradually reduced.

5. An amplifier according to claim 4, wherein, during transition from said second operating mode to said first operating mode, the pulse area of said pulses of said first and said second outputs of said difference amplifier being gradually increased.

6. An amplifier according to claim 1, wherein said PWM signal output to said load being provided by signal difference between said first and said second outputs, characterized in that said output PWM signal output being substantially symmetrical about the centreline of the respective PWM cycle except during transition between operating modes.

7. An amplifier according to claim 6, said first operating voltage being higher than said second operating voltage, characterized in that, during transition from said first operating mode to said second operating mode, the output PWM pulses being gradually shifted from the centreline towards the right end of a PWM cycle.

8. An amplifier according to claim 7, characterized in that, during transition from said second operating mode to said first operating mode, the output PWM pulses being gradually shifted from the right side towards the centreline of a PWM cycle.

9. An amplifier according to claim 7, characterized in that, during transition from said first operating mode to said second operating mode, the pulse height of said PWM pulse being substantially characteristic of said first operating mode.

10. An amplifier according to claim 9, characterized in that, during transition from said second operating mode to said first operating mode, the pulse height of said PWM pulse during transition being also substantially characteristic of said first operating mode.

11. An amplifier including a difference amplifier, said difference amplifier including a first output and a second output which are adapted for providing a PWM signal output to a load by signal differencing between said first and said second outputs, said difference amplifier being adapted for operating in at least first and second alternative operating modes which are respectively characterised by first and second operating voltages, wherein pulses of said PWM signal output being substantially symmetrical about the centreline of their respective PWM cycles during said first and second operating modes and being drifted away from said centreline during transition from one operating mode to another so that voltage continuity at said first and said second outputs can be provided during said transition.

12. An amplifier according to claim 11, wherein drifting of said PWM pulses from said centreline being co-incident with the gradual changing of the pulse width of pulses of said first and said second outputs of said difference amplifier.

13. An amplifier according to claim 12, wherein when said difference amplifier changes from said first operating mode of a higher characteristic operating mode of a higher characteristic operating voltage to said second operating mode of a lower characteristic operating voltage, the pulses of said first and second outputs being gradually narrowed while said PWM pulses being shifted gradually towards the right side of the PWM cycle centreline.

14. An amplifier according to claim 13, wherein when said difference amplifier changes from said second operating mode to said first operating mode, the pulses of said first and second outputs of said difference amplifier being gradually broadened while said PWM pulses being shifted gradually towards the centreline of the PWM cycle from the right edge of the PWM cycle.

15. An amplifier including control means, signal processing means and a difference amplifier, said difference amplifier including a first output and a second output which are adapted for PWM signal output to a load by signal difference between said first and said second outputs, said difference amplifier being adapted for operating in at least first and second alternative operating modes which are respectively characterised by first and second operating voltages, said control means including means for evaluating the signal characteristics of an incoming signal, means for determining the operating modes of said difference amplifier according to predetermined criteria and means for controlling the operating modes of said difference amplifier, so that, upon detection of a transition signal, said difference amplifier will enter into transition mode before changing its operating modes, wherein, during said transition mode, the pulse area of the pulses of said first and second outputs of said difference amplifier is changed according to a pre-determined manner so that the pulse area of pulses of said first and second outputs at the end of said transitional mode is comparable to that immediately after the change of said operating modes.

16. An amplifier according to claim 15, wherein said predetermined criteria including the continuous reading of samples exceeding a threshold number and below a threshold amplitude.

17. An amplifier including a difference amplifier and signal processing means, said difference amplifier including a first output and a second output which are adapted for providing a PWM signal output to a load by signal difference between said first and said second outputs, said difference amplifier being adapted for operating in at least first and second alternative operating modes which are respectively characterised by first and second operating voltages, said signal processing means including means to adjust the output voltages of said first and second outputs, so that, during transition from one operating mode to another, the output voltages of said first and second outputs of said difference amplifier being changed according to a pre-determined manner so that there is a substantial degree of continuity of the output voltages of said first and second outputs and said PWM output during the transition.

18. An amplifier according to claim 17, wherein said pre-determined manner including gradual adjustment of the voltage of said first and said second outputs of said difference amplifier while maintaining a correct differential PWM output.

19. An amplifier according to claim 17, wherein said pre-determined manner including gradual adjustment of the voltage area of the pulses of said first and said second outputs of said difference amplifier while maintaining a correct voltage area of said PWM output.

20. A digital amplifier including a higher voltage amplifying branch, a lower voltage amplifying branch, digital signal processing means, control means for selectively amplifying a digital signal alternatively by said higher voltage amplifier branch or said lower voltage amplifying branch for output and for controlling the transition between amplification by said higher voltage amplifier branch and said low voltage amplifier branch, conversion means for converting a digital signal for amplification between said higher voltage amplifying branch and said lower voltage amplifying branch upon detection of a transition signal, wherein, during said transition between amplification by said higher voltage amplifier branch and said lower voltage amplifier branch, the effective pulse area of the digital signal to be amplified by either said higher voltage amplifying branch and said lower voltage amplifying branch remains substantially unchanged.

21. A digital amplifier comprising a difference amplification means and control means, said difference amplification means comprising means for amplifying first and second pulsed signal streams for producing an amplified signal stream by difference, said difference amplification means operating in first and second alternative operating modes for outputting pulsed signals at first and second voltage levels of unequal amplitudes, said control means gradually changing the pulse widths of signal pulses of said first and second pulsed signal streams during transition between said first and said second operating modes while maintaining a substantially constant difference between the pulse area of the corresponding individual pulses of said first and second pulsed signal streams.

22. A digital amplifier of claim 21, wherein said first and second operating modes are respectively large and small signal operating modes with said first voltage level significantly higher than said second voltage level, the pulse width of the individual signal pulses of said first and second pulsed signal streams being gradually increased for the same extent during transition from said large signal operating mode to said small signal operating mode.

23. A digital amplifier of claim 21, wherein said first and second operating modes are respectively large and small signal operating modes with said first voltage level significantly higher than said second voltage level, the pulse width of the individual signal pulses of said first and second pulsed signal streams being increased and then gradually decreased for the same extent during transition from said small signal operating mode to said large signal operating mode.

* * * * *